(12) United States Patent
Polley et al.

(10) Patent No.: US 11,567,107 B2
(45) Date of Patent: Jan. 31, 2023

(54) DIFFERENTIAL HALL SENSOR

(71) Applicant: Texas Instruments Incorporated, Dallas, TX (US)

(72) Inventors: Arup Polley, Richardson, TX (US); Srinath M. Ramaswamy, Murphy, TX (US); Baher S. Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/138,977

(22) Filed: Dec. 31, 2020

(65) Prior Publication Data

US 2022/0206044 A1 Jun. 30, 2022

(51) Int. Cl.
*G01R 15/20* (2006.01)

(52) U.S. Cl.
CPC .................................. *G01R 15/202* (2013.01)

(58) Field of Classification Search
CPC .................................................... G01R 15/202
USPC .................................................... 324/117 H
See application file for complete search history.

(56) References Cited

U.S. PATENT DOCUMENTS

| | | | |
|---|---|---|---|
| 4,464,629 A * | 8/1984 | Tanaka | G01R 19/10 330/6 |
| 2016/0282425 A1* | 9/2016 | Haas | G01R 33/072 |
| 2016/0293834 A1 | 10/2016 | Polley et al. | |
| 2017/0067970 A1 | 3/2017 | Polley et al. | |
| 2017/0192078 A1 | 7/2017 | Polley et al. | |
| 2017/0234910 A1* | 8/2017 | Nakamura | G01R 33/0029 324/251 |
| 2017/0363445 A1 | 12/2017 | Polley et al. | |
| 2017/0363693 A1 | 12/2017 | Polley et al. | |
| 2018/0275214 A1* | 9/2018 | Haas | G01R 19/0092 |
| 2019/0317175 A1 | 10/2019 | Polley et al. | |
| 2020/0182950 A1 | 6/2020 | Haroun et al. | |

OTHER PUBLICATIONS

Jiang et al., A Continuous-Time Ripple Reduction Technique for Spinning-Current Hall Sensors, 49 IEEE J. Solid-State Circuits 1525 (Jul. 2014) (available at https://ieeexplore.ieee.org/stamp/stamp.jsp?tp=&arnumber=6811178, last accessed May 13, 2022) (Year: 2014).*

Arup Polley et al., "Residual Offset in Silicon Hall-Effect Sensor: Analytical Formula, Stress Effects, and Implications for Octagonal Hall Plate Geometry," IEEE Sensors Journal, vol. 20, No. 19, Oct. 1, 2020, 9 pages.

* cited by examiner

*Primary Examiner* — Tung X Nguyen
*Assistant Examiner* — Robert P Alejnikov, Jr.
(74) *Attorney, Agent, or Firm* — Frank D. Cimino

(57) ABSTRACT

A system comprises first and second Hall-effect sensors and an amplifier. The first Hall-effect sensor has a first bias current direction parallel to a first direction, a pair of first bias input terminals spaced along the first direction, and a pair of first sense output terminals spaced along an orthogonal second direction. The second Hall-effect sensor has a second bias current direction parallel to the second direction, a pair of second bias input terminals spaced along the second direction, and a pair of second sense output terminals connected out of phase with the first sense terminals. The amplifier has a pair of amplifier input terminals coupled to the first and second sense terminals.

20 Claims, 11 Drawing Sheets

| PHASE | HALL SENSOR | CURRENT IN | CURRENT OUT | AMPLIFIER POSITIVE (+) | AMPLIFIER NEGATIVE (-) | HALL OUTPUT | VO |
|---|---|---|---|---|---|---|---|
| 1 | 610 | 611 | 613 | 612 | 614 | S*BZS1 | GS(BZS1-BZS2) |
|   | 620 | 622 | 624 | 621 | 623 | -S*BZS2 |  |
| 2 | 610 | 612 | 614 | 613 | 611 | S*BZS1 | GS(BZS1-BZS2) |
|   | 620 | 621 | 623 | 624 | 622 | -S*BZS2 |  |
| 3 | 610 | 613 | 611 | 614 | 612 | S*BZS1 | GS(BZS1-BZS2) |
|   | 620 | 624 | 622 | 623 | 621 | -S*BZS2 |  |
| 4 | 610 | 614 | 612 | 611 | 613 | S*BZS1 | GS(BZS1-BZS2) |
|   | 620 | 623 | 621 | 622 | 624 | -S*BZS2 |  |

700

DIFFERENTIAL HALL SENSOR

BACKGROUND

Hall sensors are used for current sensing in a variety of applications, such as providing current feedback signals in motor drives. Single Hall effect magnetic sensors sense current but are subject to magnetic field interference, for example, from the Earth's magnetic field and/or from side channels in 3-phase current measurement applications. Differential Hall sensing configurations often include four Hall elements with orthogonal bias current directions and the Hall outputs connect in phase. These circuits provide the same Hall output for the same bias levels, along with reduced resistance and offset cancellation. However, using multiple Hall elements addresses first order interference but does not attenuate gradient interference. Also, the use of multiple Hall sensors adds extra circuitry for duplicating a switching network, preamplifiers and other signal chain components, leading to increased cost, circuit area and power consumption.

SUMMARY

In accordance with one aspect, a system includes first and second Hall-effect sensors and an amplifier. The first Hall-effect sensor has a first bias current, a pair of first bias input terminals and a pair of first sense output terminals. The first bias current direction is parallel to a first direction, and the pair of first bias input terminals are spaced from one another along the first direction. The pair of first sense output terminals are spaced from one another along a second direction that is orthogonal to the first direction. The second Hall-effect sensor has a second bias current direction, a pair of second bias input terminals and a pair of second sense output terminals. The second bias current direction is parallel to the second direction. The pair of second bias input terminals are spaced from one another along the second direction. The pair of second sense output terminals are connected out of phase with the first sense terminals. The amplifier has a pair of amplifier input terminals and an output terminal. The pair of amplifier input terminals is coupled to the first and second sense terminals.

In accordance with another aspect, a method of fabricating a packaged electronic device includes forming a first Hall-effect sensor on or in a substrate. The first Hall-effect sensor has a first bias current direction that is parallel to a first direction. The first Hall-effect sensor has a pair of first bias input terminals and a pair of first sense output terminals. The pair of first bias input terminals are spaced from one another along the first direction, and the pair of first sense output terminals are spaced from one another along a second direction that is orthogonal to the first direction. The method also includes forming a second Hall-effect sensor. The second Hall-effect sensor has a second bias current direction parallel to the second direction. The second Hall-effect sensor has a pair of second bias input terminals and a pair of second sense output terminals. The second bias input terminals are spaced from one another along the second direction. The second sense output terminals are connected out of phase with the first sense terminals. The method also includes forming an amplifier with a pair of amplifier input terminals coupled to the first and second sense terminals.

In accordance with another aspect, a packaged electronic device includes a semiconductor die, a package structure and leads. The semiconductor die has a first Hall-effect sensor, a second Hall-effect sensor and an amplifier. The first Hall-effect sensor has a first bias current direction parallel to a first direction, a pair of first bias input terminals spaced from one another along the first direction, and a pair of first sense output terminals spaced from one another along a second direction, the second direction being orthogonal to the first direction. The second Hall-effect sensor has a second bias current direction parallel to the second direction. The second Hall-effect sensor has a pair of second bias input terminals spaced from one another along the second direction. The second Hall-effect sensor also has and a pair of second sense output terminals connected out of phase with the first sense terminals. The amplifier has a pair of amplifier input terminals coupled to the first and second sense terminals. The package structure encloses the semiconductor die. The leads have surfaces partially exposed outside the package structure.

DETAILED DESCRIPTION

Figure 1:
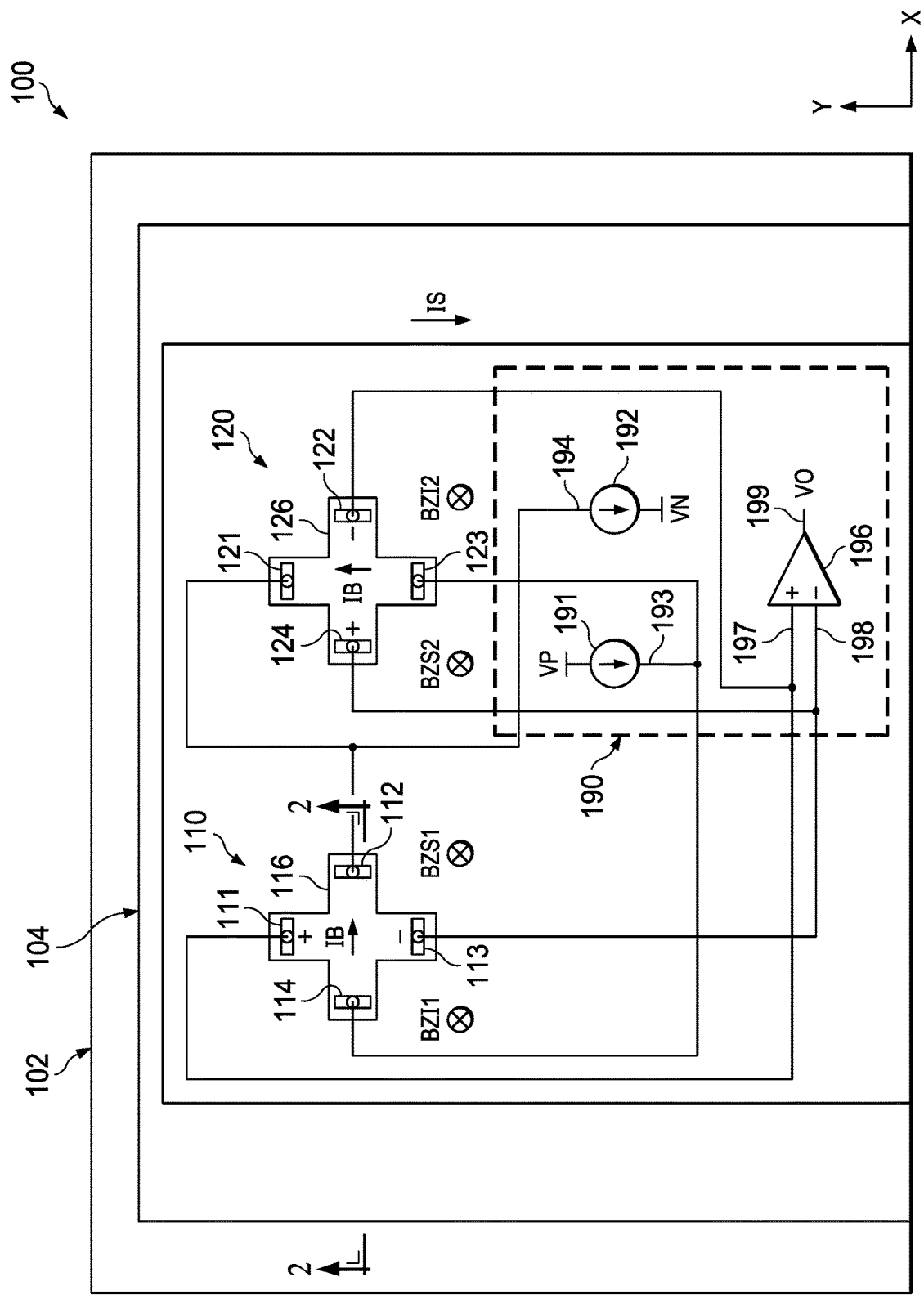
FIG. 1 is a top plan view of a Hall sensor system according to an embodiment of the invention

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 2:
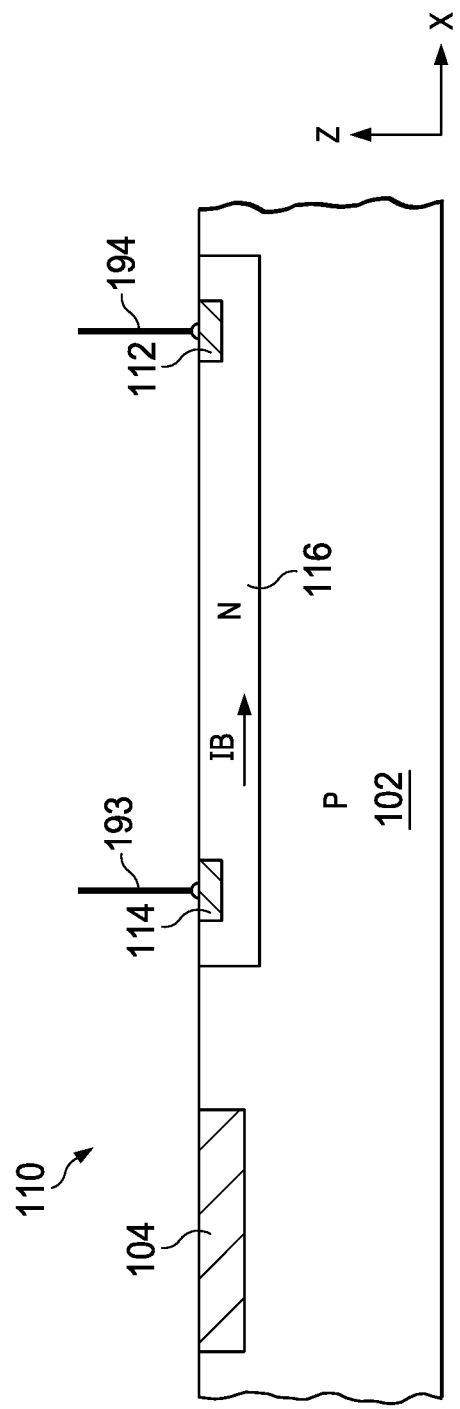
FIG. 2 is a partial sectional side elevation view of the Hall sensor system taken along line 2-2 in FIG. 1.

Referring initially to FIGS. 1 and 2, FIG. 1 shows a top view of an example Hall sensor system 100 fabricated on or in a semiconductor substrate 102. FIG. 2 shows a partial sectional side elevation view of the Hall sensor system 100 taken along line 2-2 in FIG. 1. In one example, the semiconductor substrate 102 is a silicon die formed from a starting p-doped silicon or silicon-on-insulator (SOI) wafer. As shown in FIG. 2, the example substrate 102 includes p-doped portions and n-doped portions formed therein. The die has an upper or top side that is generally planar in a plane of orthogonal first and second directions X and Y. The system 100 includes a conductor 104, such as a patterned structure formed as a conductive copper or aluminum trace.

The system 100 in FIGS. 1 and 2 has a first Hall-effect sensor 110 including four conductive terminals 111, 112, 113 and 114 formed at or near respective ends of a cross-shaped n-doped region 116 diffused or implanted into an upper portion of the p-doped substrate 102. The system 100 also includes a second Hall-effect sensor 120 having four conductive terminals 121, 122, 123 and 124 formed at or near respective ends of a second cross-shaped n-doped region 126 diffused or implanted into the upper portion of the p-doped substrate 102. In various implementations, the terminals 111-114 and 121-124 are conductive metal, such as tungsten, copper or aluminum or combinations or alloys thereof.

The first Hall-effect sensor 110 has a pair of first bias input terminals 112 and 114 spaced apart from one another along the first direction X, and a pair of first sense output terminals 111 and 113 spaced apart from one another along the orthogonal second direction Y. The first Hall-effect sensor 110 has a first bias current direction parallel to a first direction X (e.g., left to right as shown in FIGS. 1 and 2) for conducting a bias current IB from the terminal 114 to the terminal 112. The second Hall-effect sensor 120 has a pair of second bias input terminals 121 and 123 spaced apart from one another along the second direction Y, and a pair of second sense output terminals 122 and 124 that are spaced apart from one another along the first direction X. The second Hall-effect sensor 120 has a second bias current direction parallel to the second direction Y (e.g., upward in FIG. 1) for conducting a bias current IB from the terminal 123 to the terminal 121.

The system 100 includes an interface circuit 190 with bias current sources 191 and 192. The first current source 191 is coupled to a positive supply voltage VP and has an output 193 coupled to the terminals 114 and 123. In operation when the system 100 is powered, the first current source 191 sources the bias currents IB to the terminals 114 and 123 of the first and second Hall-effect sensors 110 and 120. The second current source 192 is coupled to a negative supply voltage VN and has an output 194 coupled to the terminals 112 and 121 of the respective first and second Hall-effect sensors 110 and 120. In operation, the second current source 192 sinks the bias currents IB from the terminals 112 and 121.

The pair of first sense output terminals 111 and 113 includes a first positive sense output terminal 111 and a first negative sense output terminal 113. As shown in FIG. 2, the bias current IB flows in the first Hall-effect sensor 110 from the terminal 114 to the terminal 112 such that a Hall voltage is generated (e.g., in the presence of a magnetic field) with respect to the terminals 111 and 113. The terminals 112 and 114 are formed in the N-doped region 116 through which the bias current IS flows. The first Hall-effect sensor 110 generates a first Hall voltage signal having a polarity indicated by the "+" and "−" symbols in FIG. 1 responsive to a bias current IB flowing along the first bias current direction from the terminal 114 to the terminal 112.

The polarity indications of the Hall-effect sensors herein, and the designations of the Hall-effect sensor sense terminals as positive or negative follows this convention herein with respect to the designated bias current direction of that Hall-effect sensor. Moreover, the sense output terminals of certain pairs or groups of Hall-effect sensors are interconnected in reverse polarity with out of phase connections of the respective first and second sense output terminals to selectively provide subtraction of interference effects in a Hall sensing system. In this regard, the "+" and "−" indications of the Hall-effect sensor sense terminals are consistent with the respective description of the sense terminals as "positive" or "negative" sense output terminals, whereas the connection of the sense output terminals to the respective amplifier input terminals in certain cases is reversed (i.e., the positive sense output terminal of a given Hall-effect sensor may be coupled to the positive input or the negative input of the amplifier, and the negative sense output terminal of a given Hall-effect sensor may be coupled to the negative input or the positive input of the amplifier).

The pair of second sense output terminals 122, 124 includes a second positive sense output terminal 124 and a second negative sense output terminal 122. The second Hall-effect sensor 120 generates a second Hall voltage signal having a polarity indicated by the "+" and "−" symbols in FIG. 1 responsive to the bias current IB flowing along the second bias current direction from the terminal 123 to the terminal 121.

The system 100 also includes an amplifier 196 having a pair of amplifier input terminals 197 and 198 coupled to the first and second sense terminals 111, 113, 122, 124, and an output terminal 199. The pair of amplifier input terminals 197 and 198 includes a first amplifier input terminal 197 (e.g., labeled "+" in FIG. 1) and a second amplifier input terminal 198 (e.g., labeled "−"). The second sense output terminals 122 and 124 are connected out of phase with the first sense terminals 111 and 113 as schematically shown in FIG. 1. In this example, the first amplifier input terminal 197 is coupled to the first positive sense output terminal 111 and to the second negative sense output terminal 122. The second amplifier input terminal 198 is coupled to the first negative sense output terminal 113 and to the second positive sense output terminal 124.

The conductor 104 is proximate to the first Hall-effect sensor 110 and proximate to the second Hall-effect sensor 120 in the X-Y plane. In the example of FIG. 1, the conductor 104 extends around three sides of the first and second Hall-effect sensors 110 and 120. The conductor 104 conducts a sensed current IS along the direction shown in FIG. 1. In operation, the amplifier 196 generates an output voltage signal VO at the output terminal 199 that represents a current IS flowing in the conductor 104. The conductor 104 is a patterned structure formed as a conductive copper or aluminum trace that extends around the first Hall-effect sensor 110 and the second Hall-effect sensor 120 in the X-Y plane. In this example, the flow of the sensed current IS through the conductor 104 creates a signal magnetic field BZS1=BZS2 with a direction into the page in FIG. 1 for both the first and second Hall-effect sensors 110 and 120. The signal magnetic field BZS1=BZS2 is proportional to the current IS flowing in the conductor 104. In this example, with the conductor 104 extending around three sides of the first and second Hall-effect sensors 110 and 120, both Hall-effect sensors 110 and 120 are subjected to the same interference magnetic field levels BZI1=BZI2 (e.g., shown in the direction into the page in FIG. 1). External magnetic fields proximate to the system 100 affect the Hall-effect sensors, which generate Hall voltages in response to both the interference magnetic field and the signal magnetic field caused by current flow in the conductor 104. Examples of interference magnetic field sources include fields generated by current carrying conductors in proximity to the system 100, such as magnetic fields generated by a second or third adjacent motor drive phase line where the system 100 is configured to sense the current flow in a first phase line. As the current in the second or third phase lines do not encircle the Hall-effect sensors 110 and 120 of the illustrated system 100, the interference magnetic field incident to the Hall-effect sensors 110 and 120 is generally equal, and the interference magnetic field level BZI1 of the first Hall-effect sensor 110 is substantially equal to the interference magnetic field level BZI2 of the second Hall-effect sensor 120. To model the interference field effects, the interference magnetic field is shown in the illustrated examples as being normal to the X-Y plane in the direction into the page. In another configuration, the interference magnetic field can be considered in the direction out of the page in the figures.

Due to the reverse polarity or out of phase connections of the first and second sense output terminals 111, 113 and 122, 124 provides signal subtraction at the Hall-effect sensor output for differential sensing. The illustrated examples facilitate in-package differential sensing across the current currying conductor 104 inside package with little or no increase in switching, preamplifier or signal processing circuits. In this regard, the example first and second Hall-effect sensors 110 and 120 share the amplifier 196 with differential interference signal subtraction through out of phase amplifier input connections, rather than using two separate amplifiers and an output subtractor (not shown). The illustrated examples, moreover, can be implemented by minor reconfiguration and/or replacement of existing Hall-effect sensors with nominal die area increment to accommodate packaging and trace placement.

In addition, the illustrated concepts of shared amplifier circuitry and out of phase input connections is compatible with, and extensible to high-bandwidth architectures and to systems using more than two Hall-effect sensors as described further below in connection with FIGS. 4, 5 and 8, as well as combination with Hall-sensor spinning circuitry (e.g., FIGS. 6 and 8), and/or integrated bus bar current sensing (e.g., FIGS. 9 and 10) for differential sensing across a current currying conductor inside or outside a semiconductor device package.

Figure 3:
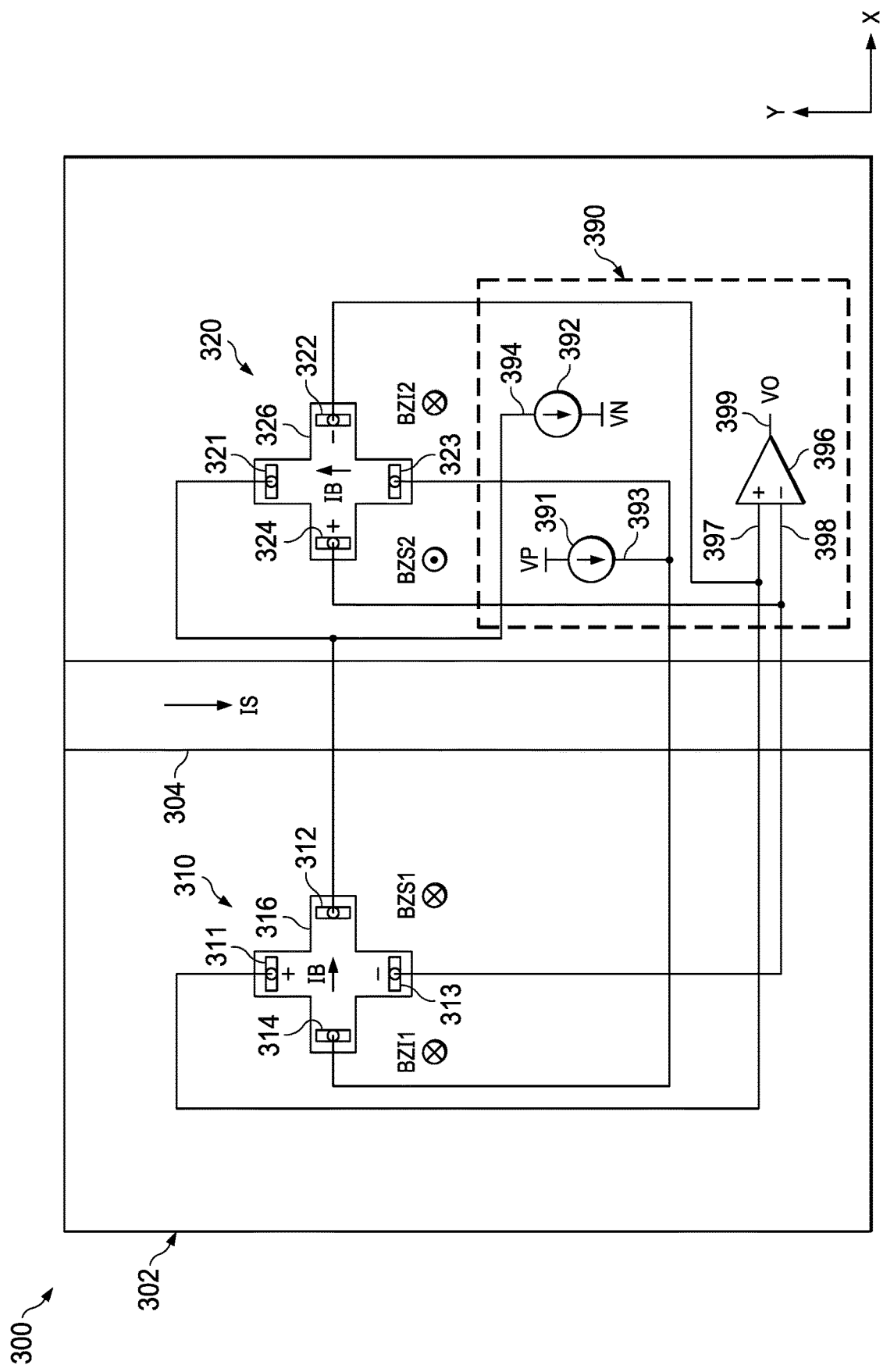
FIG. 3 is a top plan view of another Hall sensor system according to an embodiment of the invention.

FIG. 3 shows a top view of another Hall-effect sensor system 300 fabricated on or in a semiconductor substrate 302 with an in-package current carrying conductor 304 that extends between a first Hall-effect sensor 310 and a second Hall-effect sensor 320 in the X-Y plane. The semiconductor substrate 302 is a silicon die formed from a starting p-doped silicon or silicon-on-insulator (SOI) wafer. The substrate 302 includes p-doped portions and n-doped portions formed therein. The die has an upper or top side that is generally planar in a plane of orthogonal first and second directions X and Y. The conductor 304 is a patterned structure formed as a conductive copper or aluminum trace that extends between the first Hall-effect sensor 310 and the second Hall-effect sensor 320 in the X-Y plane. The first Hall-effect sensor 310 includes four conductive terminals 311, 312, 313 and 314 formed at or near respective ends of a cross-shaped n-doped region 316 diffused or implanted into an upper portion of the p-doped substrate 302. The second Hall-effect sensor 320 has four conductive terminals 321, 322, 323 and 324 formed at or near respective ends of a second cross-shaped n-doped region 326 diffused or implanted into the upper portion of the p-doped substrate 302. In various implementations, the terminals 311-314 and 321-324 are conductive metal, such as tungsten, copper or aluminum or combinations or alloys thereof.

The first Hall-effect sensor 310 also has a pair of first bias input terminals 312 and 314 spaced apart from one another along the first direction X, and a pair of first sense output terminals 311 and 313 spaced apart from one another along the orthogonal second direction Y. The first Hall-effect sensor 310 has a first bias current direction parallel to the first direction X (e.g., left to right as shown in FIG. 3) for conducting a bias current IB from the terminal 314 to the terminal 312. The second Hall-effect sensor 320 has a pair of second bias input terminals 321 and 323 spaced apart from one another along the second direction Y, and a pair of second sense output terminals 322 and 324 that are spaced apart from one another along the first direction X. The second Hall-effect sensor 320 has a second bias current direction parallel to the second direction Y (e.g., upward in FIG. 3) for conducting a bias current IB from the terminal 323 to the terminal 321.

The system 300 includes an interface circuit 390 with bias current sources 391 and 392. The first current source 391 is coupled to a positive supply voltage VP and has an output 393 coupled to the terminals 314 and 323. In operation when the system 300 is powered, the first current source 391 sources the bias currents IB to the terminals 314 and 323 of the first and second Hall-effect sensors 310 and 320. The second current source 392 is coupled to a negative supply voltage VN and has an output 394 coupled to the terminals 312 and 321 of the respective first and second Hall-effect sensors 310 and 320. In operation, the second current source 392 sinks the bias currents IB from the terminals 312 and 321.

The pair of first sense output terminals 311 and 313 includes a first positive sense output terminal 311 and a first negative sense output terminal 313. The bias current IB flows from the terminal 314 to the terminal 312 such that a Hall voltage is generated (e.g., in the presence of a magnetic field) with respect to the terminals 311 and 313. The terminals 312 and 314 are formed in the N-doped region 316 through which the bias current IS flows. The first Hall-effect sensor 310 generates a first Hall voltage signal having a polarity indicated by the "+" and "−" symbols in FIG. 3 responsive to the bias current IB flowing along the first bias current direction from the terminal 314 to the terminal 312. The pair of second sense output terminals 322, 324 includes a second positive sense output terminal 324 and a second negative sense output terminal 322. The second Hall-effect sensor 320 generates a second Hall voltage signal having a polarity indicated by the "+" and "−" symbols in FIG. 3 responsive to the bias current IB flowing along the second bias current direction from the terminal 323 to the terminal 321.

The system 300 also includes an amplifier 396 having a pair of amplifier input terminals 397 and 398 coupled to the first and second sense terminals 311, 313, 322, 324, and an output terminal 399. The pair of amplifier input terminals 397 and 398 includes a first amplifier input terminal 397 (e.g., labeled "+" in FIG. 3) and a second amplifier input terminal 398 (e.g., labeled "−"). The second sense output terminals 322 and 324 are connected out of phase with the first sense terminals 311 and 313 as shown in FIG. 3. The first amplifier input terminal 397 is coupled to the first positive sense output terminal 311 and to the second negative sense output terminal 322. The second amplifier input terminal 398 is coupled to the first negative sense output terminal 313 and to the second positive sense output terminal 324.

The conductor 304 is proximate to the first Hall-effect sensor 310 and proximate to the second Hall-effect sensor 320 in the X-Y plane. In this example, the flow of the sensed current IS through the conductor 304 creates a signal magnetic field BZS1=BZS2 with a direction into the page in FIG. 3 for the first Hall-effect sensor 310 and out of the page for the second Hall-effect sensor 320. The signal magnetic field BZS1=BZS2 is proportional to the current IS flowing in the conductor 304. In this example, with the conductor 304 extending between the first and second Hall-effect sensors 310 and 320, and the reverse polarity or out of phase connections of the first and second sense output terminals 311, 313 and 322, 324 provides interference signal subtraction at the Hall-effect sensor output for differential sensing. External magnetic fields proximate to the system 300 affect the Hall-effect sensors, which generate Hall voltages in response to both the interference magnetic field and the signal magnetic field caused by current flow in the conductor 304. As the current flow in the source of the interference magnetic field do not encircle the Hall-effect sensors 310 and 320, the interference magnetic fields BZI1 and BZI2 incident to the respective Hall-effect sensors 310 and 320 is generally equal, and the interference magnetic fields BZI1 and BZI2 are shown in the direction into the page in FIG. 3.

Figure 4:
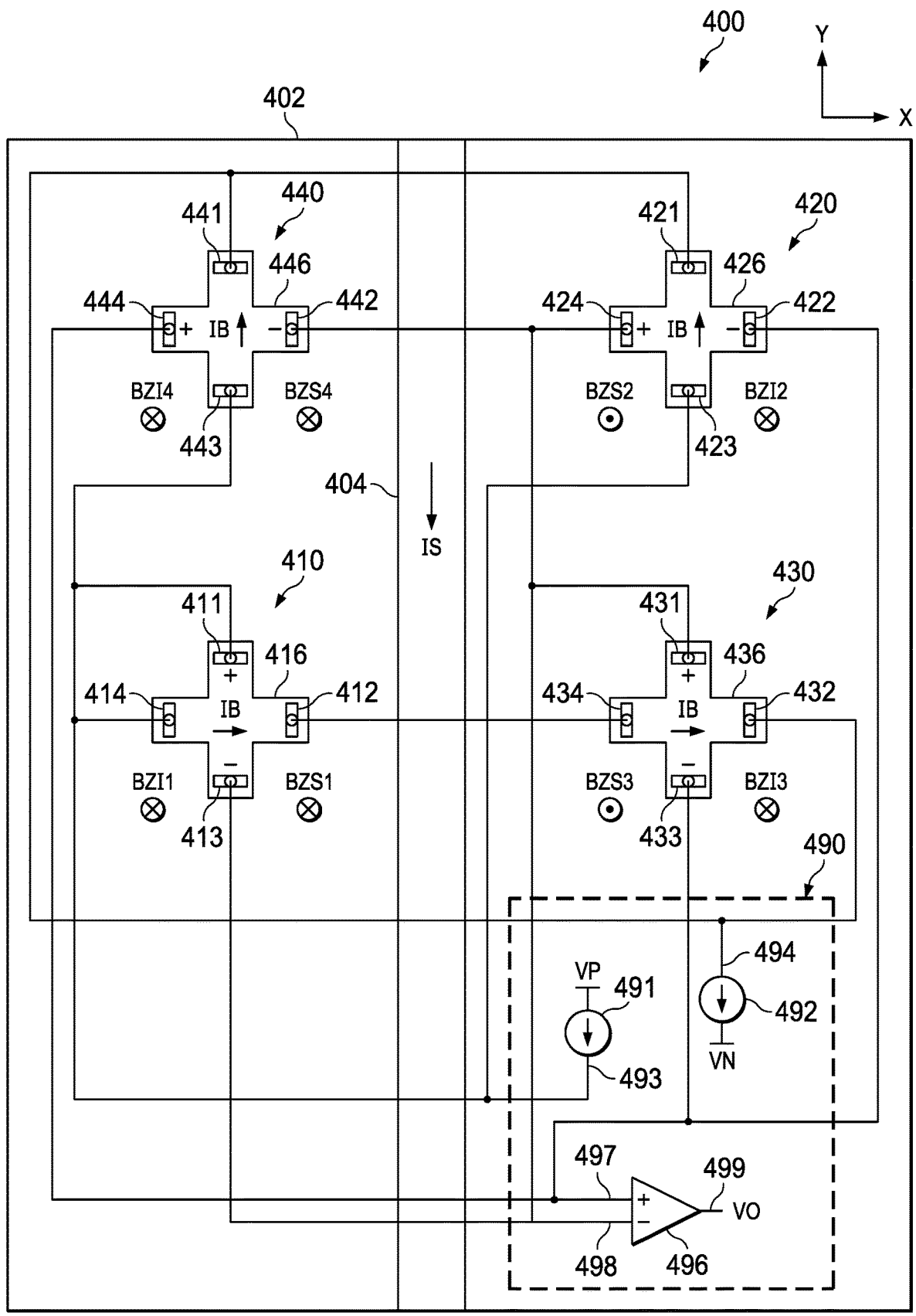
FIG. 4 is a top plan view of another Hall sensor system according to an embodiment of the invention.

FIG. 4 shows a top view of another Hall sensor system 400 fabricated on or in a semiconductor substrate 402 with an in-package current carrying conductor 404 that extends between a first Hall-effect sensor 410 and a second Hall-effect sensor 420 in the X-Y plane. The semiconductor substrate 402 is a silicon die formed from a starting p-doped silicon or silicon-on-insulator (SOI) wafer. The substrate 402 includes p-doped portions and n-doped portions formed therein. The die has an upper or top side that is generally planar in a plane of orthogonal first and second directions X and Y. The conductor 404 is a patterned structure formed as a conductive copper or aluminum trace that extends between the first Hall-effect sensor 410 and the second Hall-effect sensor 420 in the X-Y plane. The first Hall-effect sensor 410 includes four conductive terminals 411, 412, 413 and 414 formed at or near respective ends of a cross-shaped n-doped region 416 diffused or implanted into an upper portion of the p-doped substrate 402. The second Hall-effect sensor 420 has four conductive terminals 421, 422, 423 and 424 formed at or near respective ends of a second cross-shaped n-doped region 426 diffused or implanted into the upper portion of the p-doped substrate 402. In various implementations, the terminals 411-414 and 421-424 are conductive metal, such as tungsten, copper or aluminum or combinations or alloys thereof.

The first Hall-effect sensor 410 also has a pair of first bias input terminals 412 and 414 spaced apart from one another along the first direction X, and a pair of first sense output terminals 411 and 413 spaced apart from one another along the orthogonal second direction Y. The first Hall-effect sensor 410 has a first bias current direction parallel to the first direction X (e.g., left to right as shown in FIG. 4) for conducting a bias current IB from the terminal 414 to the terminal 412. The second Hall-effect sensor 420 has a pair of second bias input terminals 421 and 423 spaced apart from one another along the second direction Y, and a pair of second sense output terminals 422 and 424 that are spaced apart from one another along the first direction X. The second Hall-effect sensor 420 has a second bias current direction parallel to the second direction Y (e.g., upward in FIG. 4) for conducting a bias current IB from the terminal 423 to the terminal 421.

The system 400 also includes a third Hall-effect sensor 430 having a pair of third bias input terminals 432 and 434 spaced apart from one another along the first direction X. The third Hall-effect sensor 430 has a pair of third sense output terminals 431 and 433 spaced apart from one another along the second direction Y. The third Hall-effect sensor 430 also has a third bias current direction parallel to the first direction X. The system 400 also includes a fourth Hall-effect sensor 440 having a pair of fourth bias input terminals 441 and 443 spaced apart from one another along the second direction Y, and a pair of fourth sense output terminals 442 and 444 connected out of phase with the third sense terminals 431 and 433. The fourth Hall-effect sensor 440 has a fourth bias current direction parallel to the second direction Y. The pair of amplifier input terminals 497 and 498 is coupled to the sense terminals 431, 433, 442 and 444. The pair of third sense output terminals 431 and 433 includes a third positive sense output terminal 431 and a third negative sense output terminal 433. The pair of fourth sense output terminals 442 and 444 includes a fourth positive sense output terminal 444 and a fourth negative sense output terminal 442.

The system 400 in FIG. 4 includes an interface circuit 490 with bias current sources 491 and 492. The first current source 491 is coupled to a positive supply voltage VP and has an output 493 coupled to the terminals 414 and 423. In operation when the system 400 is powered, the first current source 491 sources the bias currents IB to the terminals 414 and 423 of the first and second Hall-effect sensors 410 and 420. The second current source 492 is coupled to a negative supply voltage VN and has an output 494 coupled to the terminals 412 and 421 of the respective first and second Hall-effect sensors 410 and 420. In operation, the second current source 492 sinks the bias currents IB from the terminals 412 and 421.

The pair of first sense output terminals 411 and 413 includes a first positive sense output terminal 411 and a first negative sense output terminal 413. The bias current IB flows from the terminal 414 to the terminal 412 such that a Hall voltage is generated (e.g., in the presence of a magnetic field) with respect to the terminals 411 and 413. The terminals 412 and 414 are formed in the N-doped region 416 through which the bias current IS flows. The first Hall-effect sensor 410 generates a first Hall voltage signal having a polarity indicated by the "+" and "−" symbols in FIG. 4 responsive to the bias current IB flowing along the first bias current direction from the terminal 414 to the terminal 412. The pair of second sense output terminals 422 and 424 includes a second positive sense output terminal 424 and a second negative sense output terminal 422. The second Hall-effect sensor 420 generates a second Hall voltage signal having a polarity indicated by the "+" and "−" symbols in FIG. 4 responsive to the bias current IB flowing along the second bias current direction from the terminal 423 to the terminal 421.

The system 400 also includes an amplifier 496 having a pair of amplifier input terminals 497 and 498 coupled to the sense terminals 411, 413, 422, 424, and an output terminal 499. The pair of amplifier input terminals 497 and 498 includes a first amplifier input terminal 497 (e.g., labeled "+" in FIG. 4) and a second amplifier input terminal 498 (e.g., labeled "−"). The second sense output terminals 422 and 424 are connected out of phase with the first sense terminals 411 and 413 as shown in FIG. 4.

In this example, the first amplifier input terminal 497 is coupled to the first positive sense output terminal 411 and to the second negative sense output terminal 422. The first amplifier input terminal 497 is also coupled to the third negative sense output terminal 433 and to the fourth positive sense output terminal 444. The second amplifier input terminal 498 is coupled to the first negative sense output terminal 413 and to the second positive sense output terminal 424. The second amplifier input terminal 498 is also coupled to the third positive sense output terminal 431 and to the fourth negative sense output terminal 442.

The conductor 404 is proximate to the first, second, third and fourth Hall-effect sensors 410, 420, 430 and 440 in the X-Y plane. In this example, the first and fourth Hall-effect sensors 410 and 440 are positioned on the left lateral side of the conductor 404, and the second and third Hall-effect sensors 420 and 430 are positioned on the right lateral side of the conductor 404 as shown in the top view of FIG. 4. The flow of the sensed current IS through the conductor 404 creates a signal magnetic fields BZS1=BZS4 with a direction into the page in FIG. 4 for the first Hall-effect sensor 410 and the fourth Hall-effect sensor 440. The current IS creates equal and opposite signal magnetic fields BZS2=BZS3 out of the page for the second Hall-effect sensor 420 and the third Hall-effect sensor 430. The magnitudes or absolute values of the signal magnetic fields IBZS1I=IBZS2I=IBZS3I=IBZS4I are proportional to the current IS flowing in the conductor 404. In this example, the conductor 404 extends between the first Hall-effect sensor 410 and the third Hall-effect sensor 430. The conductor 404 also extends between the second Hall-effect sensor 420 and the fourth Hall-effect sensor 440. The Hall-effect sensors are all subjected to generally equal interference magnetic fields BZI1=BZI2=BZI3=BZI4 (e.g., into the page in FIG. 4). External magnetic fields proximate to the system 400 affect the Hall-effect sensors, which generate Hall voltages in response to both the interference magnetic field and the signal magnetic field caused by current flow in the conductor 404. As the current flow in the source of the interference magnetic field do not encircle the Hall-effect sensors 410, 420, 430 and 440, the interference magnetic fields BZI1, BZI2, BZI3 and BZI4 incident to the respective Hall-effect sensors 410, 420, 430 and 440 is generally equal, and the interference magnetic fields BZI1, BZI2, BZI3 and BZI4 are shown in the direction into the page in FIG. 4.

Figure 5:
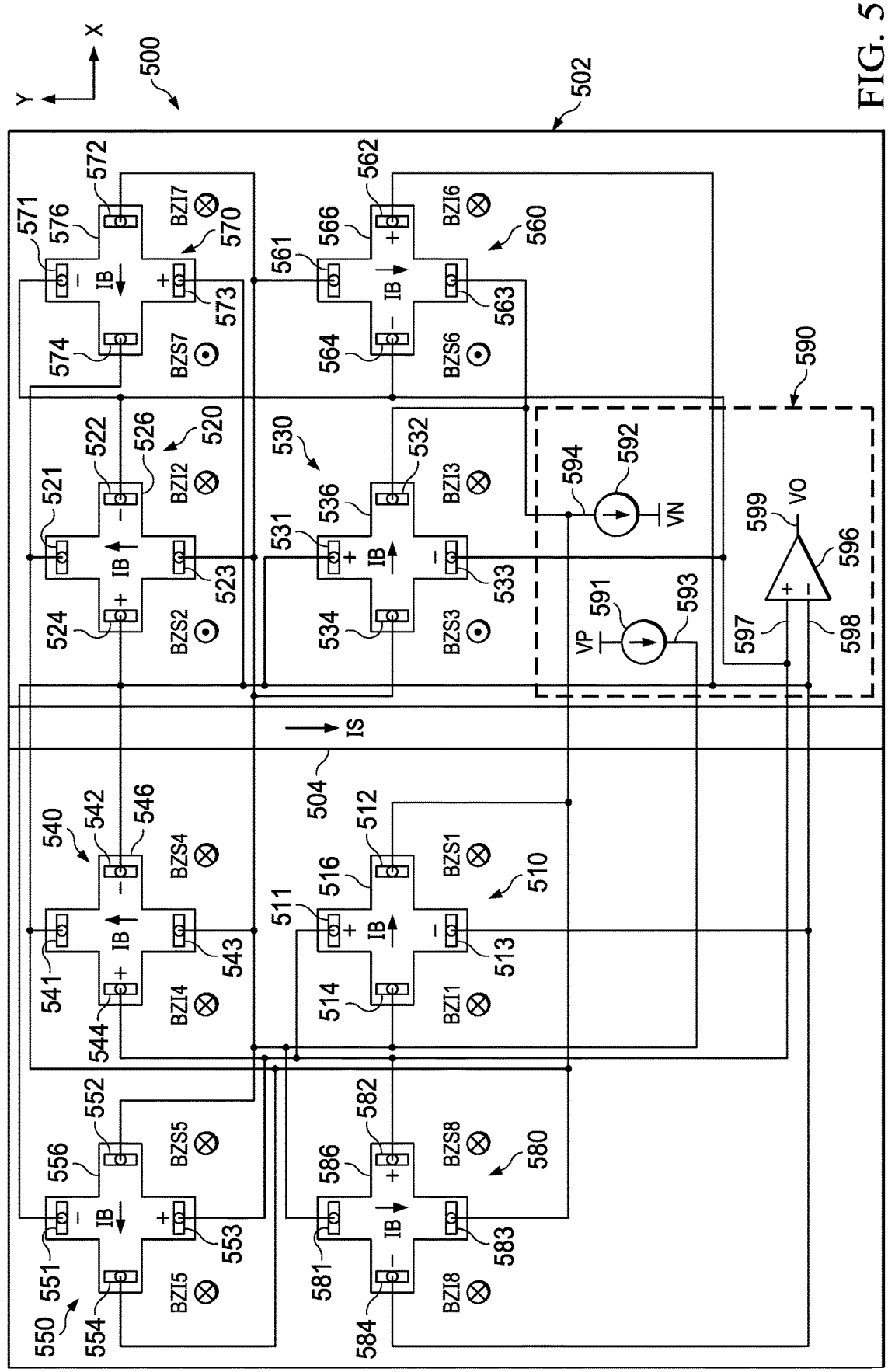
FIG. 5 is a top plan view of another Hall sensor system according to an embodiment of the invention.

FIG. 5 shows a top plan view of another Hall sensor system 500 with eight Hall-effect sensors fabricated on or in a semiconductor substrate 502. The system 500 has an in-package current carrying conductor 504 that extends between four of the Hall-effect sensors on the lateral left side of the conductor 504 and four Hall-effect sensors positioned on the lateral right side of the conductor 504 as shown in FIG. 5. The Hall-effect sensors on the lateral left side of the conductor 504 have their respective positive sense output terminals coupled to a positive (e.g., non-inverting) input of a shared amplifier and their respective negative sense output terminals coupled to a negative (e.g., inverting) input of the shared amplifier. The Hall-effect sensors on the lateral right side of the conductor 504 are coupled to the amplifier inputs in an out of phase or reverse polarity relationship to those on the lateral right side of the conductor 504. The Hall-effect sensors on the lateral right side of the conductor 504 have their respective positive sense output terminals coupled to a negative (e.g., inverting) input of the shared amplifier and their respective negative sense output terminals coupled to the positive (e.g., non-inverting) input of the shared amplifier.

The semiconductor substrate 502 is a silicon die formed from a starting p-doped silicon or silicon-on-insulator (SOI) wafer. The substrate 502 includes p-doped portions and n-doped portions formed therein. The substrate 502 has an upper or top side that is generally planar in a plane of orthogonal first and second directions X and Y. The conductor 504 is a patterned structure formed as a conductive copper or aluminum trace that extends between the sets of four Hall-effect sensors. The system 500 includes a first Hall-effect sensor 510 having four conductive terminals 511, 512, 513 and 514 formed at or near respective ends of a cross-shaped n-doped region 516 diffused or implanted into an upper portion of the p-doped substrate 502. A second Hall-effect sensor 520 has four conductive terminals 521, 522, 523 and 524 formed at or near respective ends of a second cross-shaped n-doped region 526 diffused or implanted into the upper portion of the p-doped substrate 502. A third Hall-effect sensor 530 has four conductive terminals 531, 532, 533 and 534 formed at or near respective ends of a third cross-shaped n-doped region 536 diffused or implanted into the upper portion of the p-doped substrate 502. A fourth Hall-effect sensor 540 has four conductive terminals 541, 542, 543 and 544 formed at or near respective ends of a fourth cross-shaped n-doped region 546 diffused or implanted into the upper portion of the p-doped substrate 502.

A fifth Hall-effect sensor 550 has four conductive terminals 551, 552, 553 and 554 formed at or near respective ends of a fifth cross-shaped n-doped region 556 diffused or implanted into the upper portion of the p-doped substrate 502. A sixth Hall-effect sensor 560 has four conductive terminals 561, 562, 563 and 564 formed at or near respective ends of a sixth cross-shaped n-doped region 566 diffused or implanted into the upper portion of the p-doped substrate 502. A seventh Hall-effect sensor 570 has four conductive terminals 571, 572, 573 and 574 formed at or near respective ends of a seventh cross-shaped n-doped region 576 diffused or implanted into the upper portion of the p-doped substrate 502. An eighth Hall-effect sensor 580 has four conductive terminals 581, 582, 583 and 584 formed at or near respective ends of an eighth cross-shaped n-doped region 586 diffused or implanted into the upper portion of the p-doped substrate 502. In various implementations, the terminals 511-514, 521-524, 531-534, 541-544, 551-554, 561-564, 571-574 and 581-584 are conductive metal, such as tungsten, copper or aluminum or combinations or alloys thereof.

The system 500 includes an interface circuit 590 with bias current sources 591 and 592. The first current source 591 is coupled to a positive supply voltage VP and has an output 593 coupled to the terminals 514, 523, 534, 543, 552, 561, 572 and 581. In operation when the system 500 is powered, the first current source 591 sources the bias currents IB to the terminals 514, 523, 534, 543, 552, 561, 572 and 581. The second current source 592 is coupled to a negative supply voltage VN and has an output 594 coupled to the terminals 512, 521, 532, 541, 554, 563, 574 and 583. In operation, the second current source 592 sinks the bias currents IB from the terminals 512, 521, 532, 541, 554, 563, 574 and 583. The interface circuit 590 includes an amplifier 596 having a pair of amplifier input terminals 597 and 598, and an output terminal 599 configured to provide an output voltage signal VO that represents the current IS flowing in the conductor 504. The pair of amplifier input terminals 597 and 598 includes a first amplifier input terminal 597 (e.g., a positive or non-inverting input terminal labeled "+" in FIG. 5) and a second amplifier input terminal 598 (e.g., a negative or inverting input terminal labeled "−").

The Hall-effect sensors 510, 540, 550 and 580 on the lateral left side of the conductor 504 have their respective positive sense output terminals 511, 544, 553 and 582 coupled to the positive (e.g., non-inverting) amplifier input terminal 597 of the shared amplifier 596. The respective negative sense output terminals 513, 542, 551 and 584 of the Hall-effect sensors 510, 540, 550 and 580 on the lateral left side of the conductor 504 are coupled to the negative (e.g., inverting) amplifier input terminal 198 of the shared amplifier 596.

The sense output terminals of the Hall-effect sensors 520, 530, 560 and 570 on the lateral right side of the conductor 504 are coupled to the amplifier inputs 597 and 598 in an out of phase or reverse polarity relationship to those on the lateral right side of the conductor 504. The Hall-effect sensors 520, 530, 560 and 570 on the lateral right side of the conductor 504 have their respective positive sense output terminals 524, 531, 562 and 573 coupled to the negative (e.g., inverting) amplifier input terminal 598 of the shared amplifier 596. The Hall-effect sensors 520, 530, 560 and 570 on the lateral right side of the conductor 504 have their respective negative sense output terminals 522, 533, 564 and 571 coupled to the positive (e.g., non-inverting) amplifier input terminal 597 of the shared amplifier 596. The flow of the sensed current IS through the conductor 504 creates substantially equal signal magnetic fields BZS1, BZS4, BZS5 and BZS8 with a direction into the page in FIG. 5, and substantially equal signal magnetic fields BZS2, BZS3, BZS6 and BZS7 with a direction out of the page in FIG. 5. The system 500 is subject to generally equal interference magnetic fields BZI1=BZI2=BZI3=BZI4=BZI5=BZI6=BZI7=BZI8 (e.g., into the page in FIG. 5). External magnetic fields proximate to the system 500 affect the Hall-effect sensors, which generate Hall voltages in response to both the interference magnetic field and the signal magnetic field caused by current flow in the conductor 504. As the current flow in the source of the interference magnetic field do not encircle the Hall-effect sensors 510, 520, 530, 540, 550, 560, 570 and 580, the interference magnetic fields BZI1, BZI2, BZI3, BZI4, BZI5, BZI6, BZI7 and BZI8 incident to the respective Hall-effect sensors 510, 520, 530, 540, 550, 560, 570 and 580 is generally equal, and the interference magnetic fields BZI1–BZI8 are shown in the direction into the page in FIG. 5.

Figure 6:
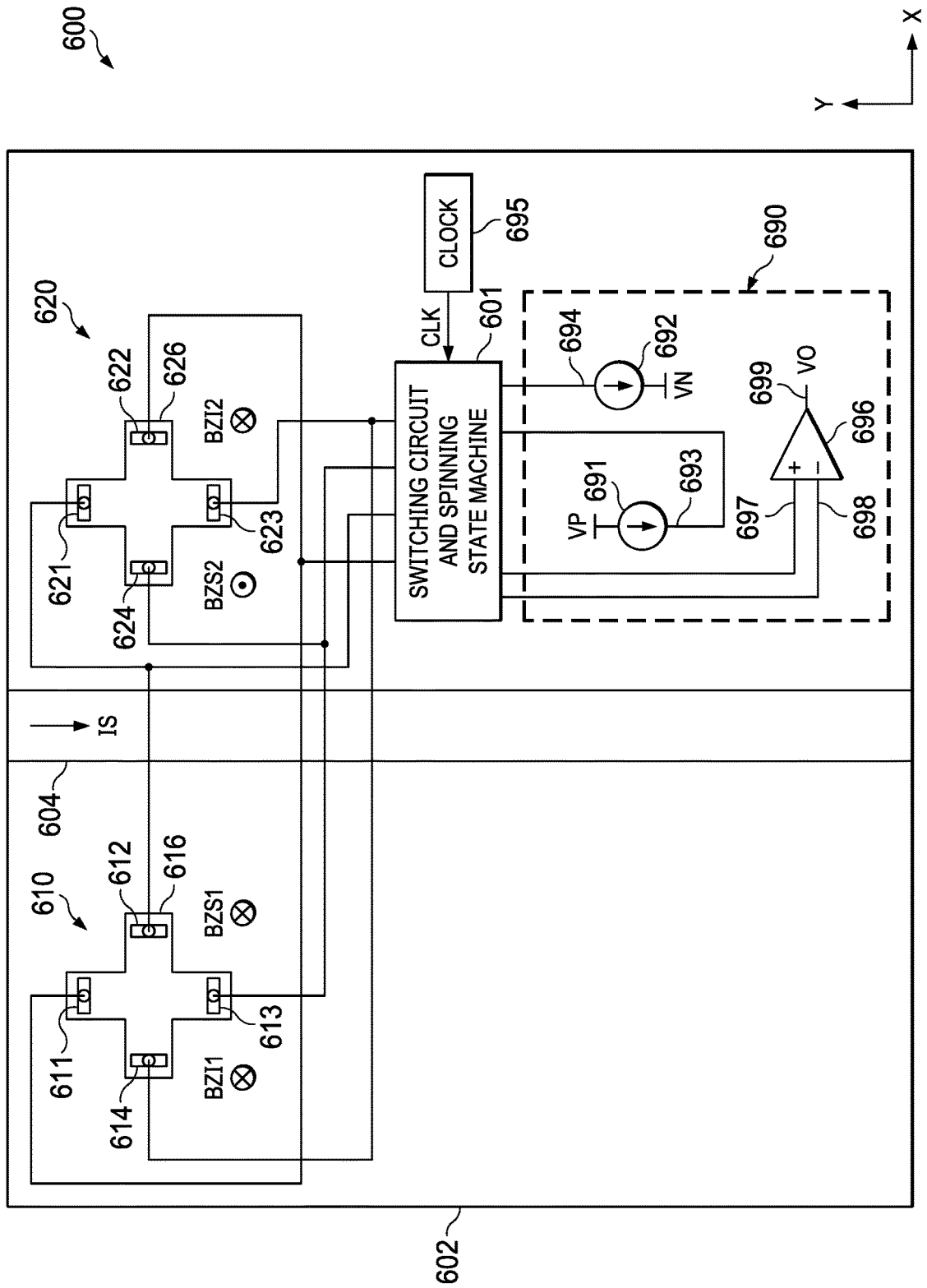
FIG. 6 is a top plan view of another Hall sensor system according to an embodiment of the invention.
Figures 7, 10:
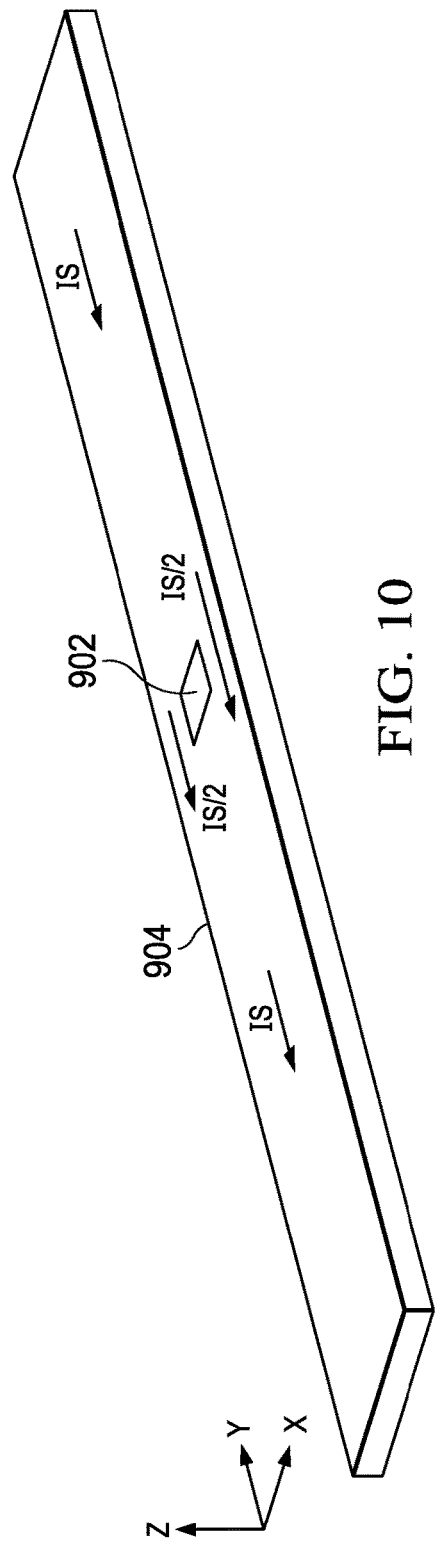
FIG. 7 is a table showing a Hall sensor switching circuit and spinning state machine operation in the hall sensor system of FIG. 6.
FIG. 10 is a perspective view of a bus bar with an integrated Hall sensor system according to an embodiment of the invention.

Referring now to FIGS. 6 and 7, FIG. 6 is a top plan view of another Hall sensor system 600 with a switching circuit and spinning state machine 601. The Hall-effect sensor system 600 is fabricated on or in a semiconductor substrate 602 with an in-package current carrying conductor 604 that extends between a first Hall-effect sensor 610 and a second Hall-effect sensor 620 in the X-Y plane. The semiconductor substrate 602 is a silicon die formed from a starting p-doped silicon or silicon-on-insulator (SOI) wafer. The substrate 602 includes p-doped portions and n-doped portions formed therein. The substrate 602 has an upper or top side that is generally planar in a plane of orthogonal first and second directions X and Y. The conductor 604 is a patterned structure formed as a conductive copper or aluminum trace that extends between the first Hall-effect sensor 610 and the second Hall-effect sensor 620 in the X-Y plane. The first Hall-effect sensor 610 includes four conductive terminals 611, 612, 613 and 614 formed at or near respective ends of a cross-shaped n-doped region 616 diffused or implanted into an upper portion of the p-doped substrate 602. The second Hall-effect sensor 620 has four conductive terminals 621, 622, 623 and 624 formed at or near respective ends of a second cross-shaped n-doped region 626 diffused or implanted into the upper portion of the p-doped substrate 602. In various implementations, the terminals 611-614 and 621-624 are conductive metal, such as tungsten, copper or aluminum or combinations or alloys thereof.

The system 600 includes an interface circuit 690 with bias current sources 691 and 692. The first current source 691 is coupled to a positive supply voltage VP and has an output 693. In operation when the system 600 is powered, the first current source 691 sources a bias current. The second current source 692 is coupled to a negative supply voltage VN and has an output 694. In operation, the second current source 692 sinks the bias current. The system 600 also includes an amplifier 696 having a pair of amplifier input terminals 697 and 698, and an output terminal 699. The pair of amplifier input terminals 697 and 698 includes a first amplifier input terminal 697 (e.g., positive or non-inverting, labeled "+" in FIG. 6) and a second amplifier input terminal 698 (e.g., negative or inverting, labeled "−").

The switching circuit and spinning state machine 601 is coupled between the Hall-effect sensors 610 and 620 and the interface circuit 690. The switching circuit and spinning state machine 601 operates according to a clock signal CLK from a clock circuit 695. The switching circuit and spinning state machine 601 is configured to selectively couple respective terminals of the Hall-effect sensors 610 and 620 to the amplifier input terminals 697 and 698 or to the output terminals 693 and 694 of the respective bias current sources 691 and 692 in individual phases of a multi-phase current spinning sequence 700 shown in FIG. 7. The current spinning sequence 700 shows four example phases 1, 2, 3 and 4 that are sequentially implemented in each sequence by the switching circuit and spinning state machine 601. In each phase, the switching circuit and spinning state machine 601 couples the bias terminals 693 (labeled "Current In" in FIG. 7) and 694 (labeled "Current Out" in FIG. 7), the first amplifier input terminal 697 (labeled "Amplifier Positive (+)" in FIG. 7) and the second amplifier input terminal 698 (labeled "Amplifier Negative (−)" in FIG. 7) with respective ones of the Hall-effect sensor terminals 611, 612, 613, 614, 621, 622, 623 and 624. The respective first and second Hall output voltages (labeled "Hall Output" in FIG. 7) are S*BZS1 and −S*BZS2 for the Hall-effect sensors 610 and 620, where S is a constant.

The output voltage VO at the amplifier output terminal 699 for each phase is GS(BZS1−BZS2), where G is the gain of the amplifier 696. In each phase, moreover, the bias current direction of the first Hall-effect sensor 610 is orthogonal to the bias current direction of the second Hall-effect sensor 620. For example, phase 4 in the table of FIG. 7 corresponds to the orientation of the first and second Hall-effect sensors 310 and 320 in FIG. 3 above, and each successive phase rotates the effective angle of the switching circuit and spinning state machine 601 by 90 degrees clockwise in the top view of FIG. 6.

Figure 8:
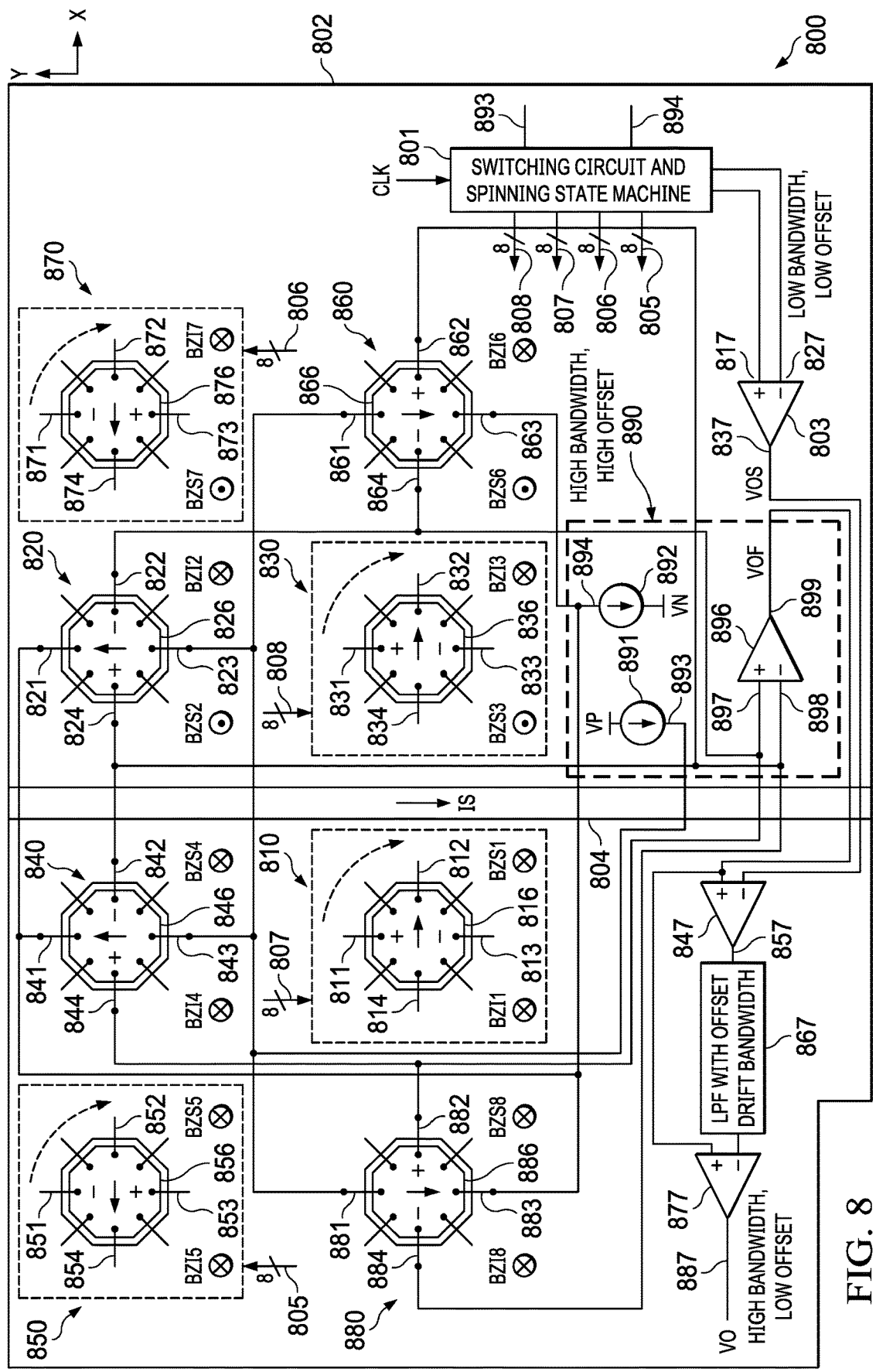
FIG. 8 is a top plan view of another Hall sensor system according to an embodiment of the invention.

FIG. 8 shows a top view of another Hall sensor system 800 that incorporates high-bandwidth differential Hall current sensing, including eight Hall-effect sensors The Hall sensor system 800 has eight Hall-effect sensors fabricated on or in a semiconductor substrate 802. The system 800 has an in-package current carrying conductor 804 that extends between four of the Hall-effect sensors on the lateral left side of the conductor 804 and four Hall-effect sensors positioned on the lateral right side of the conductor 804 in FIG. 8. Two Hall-effect sensors on each side of the conductor 804 are stationary with fixed terminal connections, and two additional Hall-effect sensors on each side are coupled to a switching circuit and spinning state machine. The stationary Hall-effect sensors are coupled to a shared high bandwidth, high offset amplifier, and the spinning Hall-effect sensors are coupled via the switching circuit and spinning state machine to a low bandwidth, low offset amplifier. The example Hall-effect sensors are shown as octagonal structures with eight terminals. Another implementation uses cross-shaped Hall-effect sensor structures.

The semiconductor substrate 802 is a silicon die formed from a starting p-doped silicon or silicon-on-insulator (SOI) wafer. The substrate 802 includes p-doped portions and n-doped portions formed therein. The substrate 802 has an upper or top side that is generally planar in a plane of orthogonal first and second directions X and Y. The conductor 804 is a patterned structure formed as a conductive copper or aluminum trace that extends between the sets of four Hall-effect sensors. The system 800 includes a first Hall-effect sensor 810 having four conductive terminals 811, 812, 813 and 814 formed at or near respective ends of an octagonal n-doped region 816 diffused or implanted into an upper portion of the p-doped substrate 802. A second Hall-effect sensor 820 has four conductive terminals 821, 822, 823 and 824 formed at or near respective ends of a second octagonal n-doped region 826 diffused or implanted into the upper portion of the p-doped substrate 802. A third Hall-effect sensor 830 has four conductive terminals 831, 832, 833 and 834 formed at or near respective ends of a third octagonal n-doped region 836 diffused or implanted into the upper portion of the p-doped substrate 802. A fourth Hall-effect sensor 840 has four conductive terminals 841, 842, 843 and 844 formed at or near respective ends of a fourth octagonal n-doped region 846 diffused or implanted into the upper portion of the p-doped substrate 802.

A fifth Hall-effect sensor 850 has four conductive terminals 851, 852, 853 and 854 formed at or near respective ends of a fifth octagonal n-doped region 856 diffused or implanted into the upper portion of the p-doped substrate 802. A sixth Hall-effect sensor 860 has four conductive terminals 861, 862, 863 and 864 formed at or near respective ends of a sixth octagonal n-doped region 866 diffused or implanted into the upper portion of the p-doped substrate 802. A seventh Hall-effect sensor 870 has four conductive terminals 871, 872, 873 and 874 formed at or near respective ends of a seventh octagonal n-doped region 876 diffused or implanted into the upper portion of the p-doped substrate 802. An eighth Hall-effect sensor 880 has four conductive terminals 881, 882, 883 and 884 formed at or near respective ends of an eighth octagonal n-doped region 886 diffused or implanted into the upper portion of the p-doped substrate 802. In various implementations, the terminals 811-814, 821-824, 831-834, 841-845, 851-854, 861-864, 871-874 and 881-884 are conductive metal, such as tungsten, copper or aluminum or combinations or alloys thereof.

The system 800 includes an interface circuit 890 with bias current sources 891 and 892. The first current source 891 is coupled to a positive supply voltage VP and has an output 893 coupled to the terminals 823, 843, 861 and 881. In operation when the system 800 is powered, the first current source 891 sources the bias currents IB to the terminals 823, 843, 861 and 881 and to the switching circuit and spinning state machine 801. The second current source 892 is coupled to a negative supply voltage VN and has an output 894 coupled to the terminals 821, 841, 863 and 883. In operation, the second current source 892 sinks the bias currents IB from the terminals 821, 841, 863 and 883 and from the switching circuit and spinning state machine 801. The interface circuit 190 includes a high bandwidth, high offset amplifier 896 having a pair of amplifier input terminals 897 and 898, and an output terminal 899 configured to provide an output voltage signal VOF that represents the current IS flowing in the conductor 804 measured by the stationary Hall-effect sensors 820, 840, 860 and 880. The pair of amplifier input terminals 897 and 898 includes a first amplifier input terminal 897 (e.g., a positive or non-inverting input terminal labeled "+" in FIG. 8) and a second amplifier input terminal 898 (e.g., a negative or inverting input terminal labeled "−"). The system 800 also includes a low bandwidth, low offset amplifier 803 having a first (+) input terminal 817, a second (−) input terminal 827 and an output terminal 837 configured to provide an output voltage signal VOS that represents the current IS flowing in the conductor 804 measured by the spinning Hall-effect sensors 810, 830, 840 and 870.

The Hall-effect sensors 820, 840, 860 and 880 are stationary with fixed interface circuit interconnections. The Hall-effect sensors 810, 830, 850 and 870 are coupled to the bias outputs of the interface circuit 890 and to the input terminals of the low bandwidth, low offset amplifier 803 via the switching circuit and spinning state machine 801. The system 800 also includes an amplifier 847 with a first input (+) coupled to the output 899 of the high bandwidth, high offset amplifier 896, a second input (−) coupled to the output 837 of the low bandwidth, low offset amplifier 803, and an output terminal 857 coupled to an input of a low pass filter (LPF) 867 having an offset drift bandwidth. The system 800 further includes an amplifier 877 having a first input (+) coupled to the output 899 of the high bandwidth, high offset amplifier 896, a second input (−) coupled to the output of the LPF 867, and an output terminal 887 that provides an output voltage signal VO that represents the sensed current IS flowing in the conductor 804.

In operation, the sensed current IS creates substantially equal signal magnetic fields BZS1, BZS4, BZS5 and BZS8 with a direction into the page in FIG. 8, and substantially equal signal magnetic fields BZS2, BZS3, BZS6 and BZS7 with a direction out of the page in FIG. 8. The system is subject to generally equal interference magnetic fields BZI1=BZI2=BZI3=BZI4=BZI5=BZI6=BZI7=BZI8 (e.g., into the page in FIG. 8). External magnetic fields proximate to the system 800 affect the Hall-effect sensors, which generate Hall voltages in response to both the interference magnetic field and the signal magnetic field caused by current flow in the conductor 804. As the current flow in the source of the interference magnetic field do not encircle the Hall-effect sensors 810, 820, 830, 840, 850, 860, 870 and 880, the interference magnetic fields BZI1, BZI2, BZI3, BZI4, BZI5, BZI6, BZI7 and BZI8 incident to the respective Hall-effect sensors 810, 820, 830, 840, 850, 860, 870 and 880 is generally equal, and the interference magnetic fields BZI1–BZI8 are shown in the direction into the page in FIG. 8. The amplifier 896 generates a first amplified signal VOF in response to the combined Hall sensor signals received from the stationary Hall-effect sensors 820, 840, 860 and 880. The amplifier 896 generates a high-frequency portion output signal having higher frequencies than the output of the low bandwidth, low offset amplifier 803. The amplifier 803 generates a second amplified signal VOS in response to the Hall sensor signals received from the spinning Hall-effect sensors 810, 830, 850 and 870. The amplifier 847 generates a subtracted output signal at the output terminal 857 in response to the difference between the first amplified signal and the second amplified signal. The LPF 867 generates an offset correction signal in response to the subtracted output signal from the amplifier 847. The LPF 867 reduces high-frequency content of the high-frequency portion output signal and generates an offset correction signal. The amplifier 877 generates a corrected Hall signal VO in response to the offset correction signal from the LPF 867 and in response to the second amplified signal from the amplifier 896.

Figure 9:
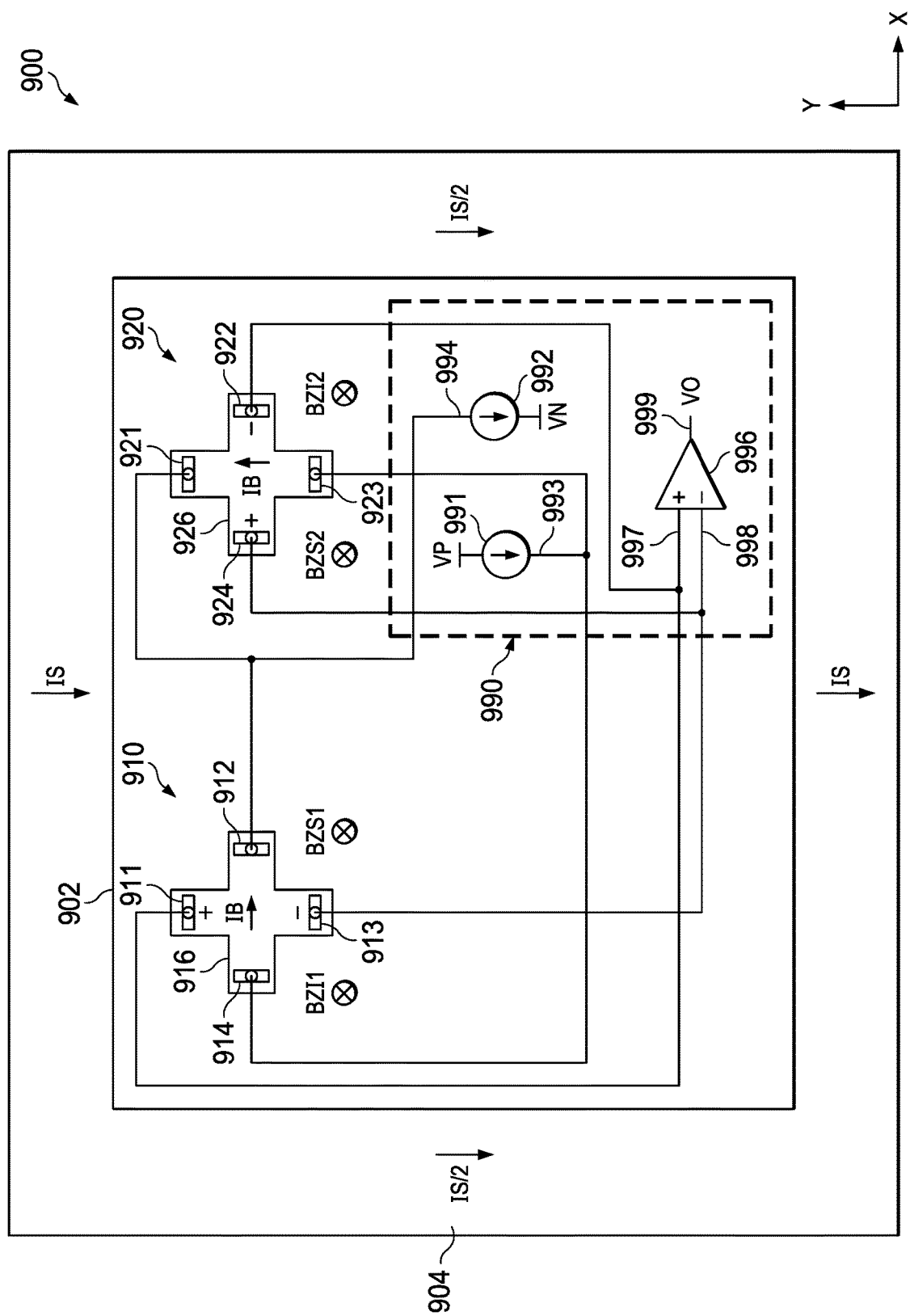
FIG. 9 is a top plan view of another Hall sensor system according to an embodiment of the invention.

Referring now to FIGS. 9 and 10, FIG. 9 shows a top view of another Hall sensor system 900 with a Hall-effect sensor die 902 integrated in a conductive busbar 904, and FIG. 10 shows a perspective view of the bus bar 904 with the integrated Hall sensor 902. In one example, the semiconductor substrate 902 is a silicon die formed from a starting p-doped silicon or silicon-on-insulator (SOI) wafer. The example substrate 902 includes p-doped portions and n-doped portions formed therein. The die has an upper or top side that is generally planar in a plane of orthogonal first and second directions X and Y. The system 900 includes a conductor 904, such as a patterned structure formed as a conductive copper or aluminum trace.

The system 900 has a first Hall-effect sensor 910 including four conductive terminals 911, 912, 913 and 914 formed at or near respective ends of a cross-shaped n-doped region 916 diffused or implanted into an upper portion of the p-doped substrate 902. The system 900 also includes a second Hall-effect sensor 920 having four conductive terminals 921, 922, 923 and 924 formed at or near respective ends of a second cross-shaped n-doped region 926 diffused or implanted into the upper portion of the p-doped substrate 902. In various implementations, the terminals 911-914 and 921-924 are conductive metal, such as tungsten, copper or aluminum or combinations or alloys thereof.

The first Hall-effect sensor 910 has a pair of first bias input terminals 912 and 914 spaced apart from one another along the first direction X, and a pair of first sense output terminals 911 and 913 spaced apart from one another along the orthogonal second direction Y. The first Hall-effect sensor 910 has a first bias current direction parallel to a first direction X (e.g., left to right in FIG. 9) for conducting a bias current IB from the terminal 914 to the terminal 912. The second Hall-effect sensor 920 has a pair of second bias input terminals 921 and 923 spaced apart from one another along the second direction Y, and a pair of second sense output terminals 922 and 924 that are spaced apart from one another along the first direction X. The second Hall-effect sensor 920 has a second bias current direction parallel to the second direction Y (e.g., upward in FIG. 9) for conducting a bias current IB from the terminal 923 to the terminal 921.

The system 900 includes an interface circuit 990 with bias current sources 991 and 992. The first current source 991 is coupled to a positive supply voltage VP and has an output 993 coupled to the terminals 914 and 923. In operation when the system 900 is powered, the first current source 991 sources the bias currents IB to the terminals 914 and 923 of the first and second Hall-effect sensors 910 and 920. The second current source 992 is coupled to a negative supply voltage VN and has an output 994 coupled to the terminals 912 and 921 of the respective first and second Hall-effect sensors 910 and 920. In operation, the second current source 992 sinks the bias currents IB from the terminals 912 and 921.

The pair of first sense output terminals 911 and 913 includes a first positive sense output terminal 911 and a first negative sense output terminal 913. As shown in FIG. 2, the bias current IB flows in the first Hall-effect sensor 910 from the terminal 914 to the terminal 912 such that a Hall voltage is generated (e.g., in the presence of a magnetic field cause by current flow in the busbar 904) with respect to the terminals 911 and 913. The terminals 912 and 914 are formed in the N-doped region 916 through which the bias current IS flows. The first Hall-effect sensor 910 generates a first Hall voltage signal having a polarity indicated by the "+" and "−" symbols in FIG. 9 responsive to a bias current IB flowing along the first bias current direction from the terminal 914 to the terminal 912. The pair of second sense output terminals 922 and 924 includes a second positive sense output terminal 924 and a second negative sense output terminal 922. The second Hall-effect sensor 920 generates a second Hall voltage signal having a polarity indicated by the "+" and "−" symbols in FIG. 9 responsive to the bias current IB flowing along the second bias current direction from the terminal 923 to the terminal 921.

The system 900 also includes a shared amplifier 996 having a pair of amplifier input terminals 997 and 998 coupled to the first and second sense terminals 911, 913, 922, 924, and an output terminal 999. The pair of amplifier input terminals 997 and 998 includes a first amplifier input terminal 997 (e.g., labeled "+" in FIG. 9) and a second amplifier input terminal 998 (e.g., labeled "−"). The second sense output terminals 922 and 924 are connected out of phase with the first sense terminals 911 and 913 as schematically shown in FIG. 9. In this example, the first amplifier input terminal 997 is coupled to the first positive sense output terminal 911 and to the second negative sense output terminal 922. The second amplifier input terminal 998 is coupled to the first negative sense output terminal 913 and to the second positive sense output terminal 924.

The conductor 904 extends around and is proximate to the first Hall-effect sensor 910 and the second Hall-effect sensor 920 in the X-Y plane. In the example of FIG. 9, the conductor 904 extends around four sides of the first and second Hall-effect sensors 910 and 920. The conductor 904 conducts a sensed current IS along the bifurcated path shown in FIG. 9. In operation, the amplifier 996 generates an output voltage signal VO at the output terminal 906 that represents a current IS flowing in the busbar conductor 904. In this example, the flow of the sensed current IS through the conductor 904 creates a signal magnetic field BZS1=BZS2 with a direction into the page in FIG. 9 for both the first and second Hall-effect sensors 910 and 920. The signal magnetic field BZS1=BZS2 is proportional to the current IS flowing in the busbar conductor 904. In this example, with the conductor 904 extending around the top, the bottom and the two lateral sides of the first and second Hall-effect sensors 910 and 920, both sensors 910 and 920 are subjected to the same interference magnetic field levels BZI1=BZI2 (e.g., shown in the direction into the page in FIG. 9). External magnetic fields proximate to the system 900 affect the Hall-effect sensors 910 and 920, which generate Hall voltages in response to both the interference magnetic field and the signal magnetic field caused by current flow in the conductor 904. As the current flow in the source of the interference magnetic field do not encircle the Hall-effect sensors 910 and 920, the interference magnetic fields BZI1 and BZI2 incident to the respective Hall-effect sensors 910 and 920 is generally equal, and the interference magnetic fields BZI1 and BZI2 are shown in the direction into the page in FIG. 9.

Figure 11:
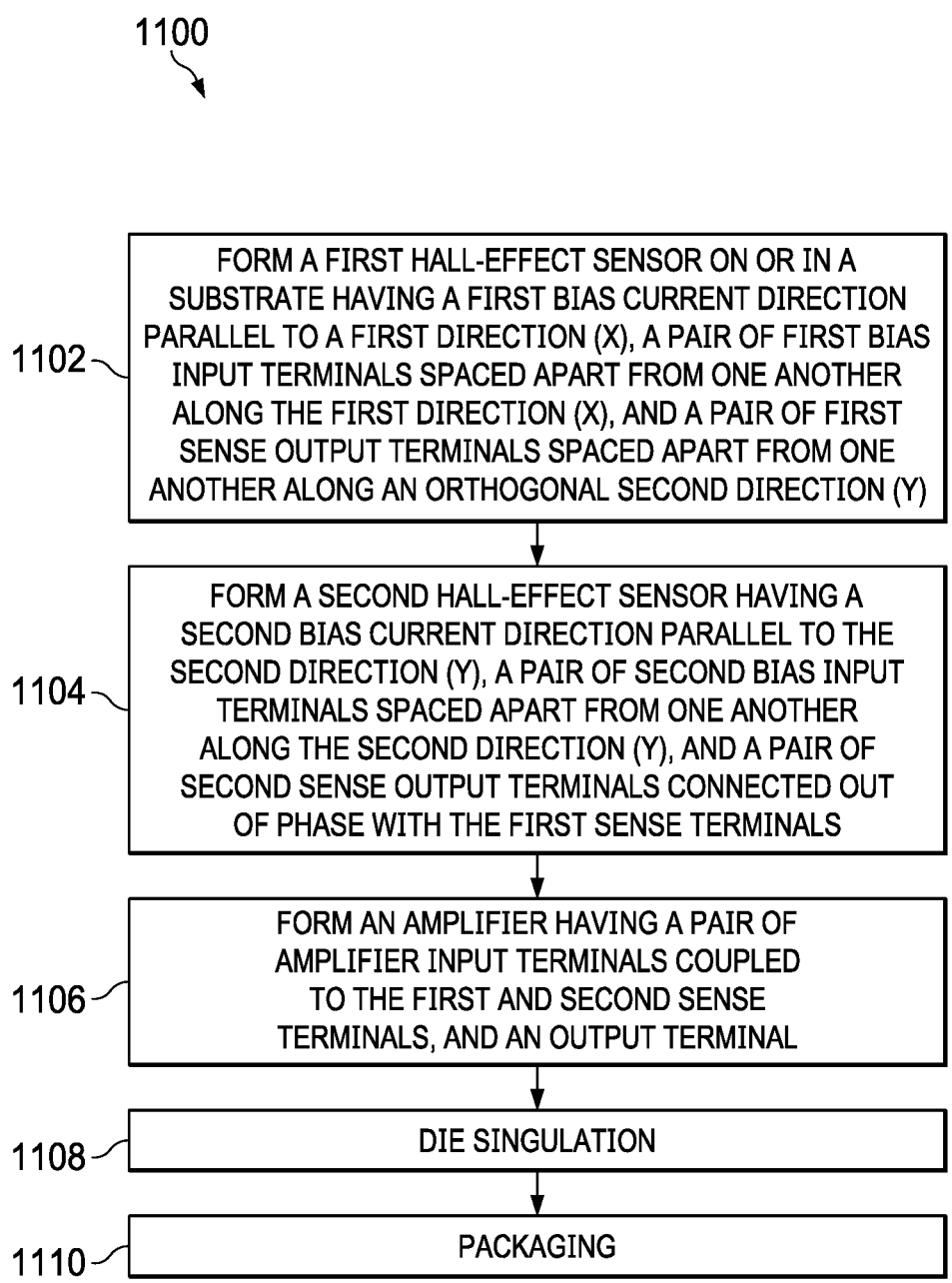
FIG. 11 is a flow diagram of a method of manufacturing a packaged electronic device according to an embodiment of the invention.

FIG. 11 shows a method 1100 of fabricating a packaged electronic device 600. The method 1100 includes forming a first Hall-effect sensor (e.g., sensor 110 above) at 1102 on or in a substrate (e.g., 102) having a first bias current direction parallel to a first direction X, a pair of first bias input terminals 112, 114 spaced apart from one another along the first direction X, and a pair of first sense output terminals 111, 113 spaced apart from one another along an orthogonal second direction Y. The method 1100 continues at 1104 with forming a second Hall-effect sensor (e.g., 120) having a second bias current direction parallel to the second direction Y, a pair of second bias input terminals 121, 123 spaced apart from one another along the second direction Y, and a pair of second sense output terminals 122, 124 connected out of phase with the first sense terminals 111, 113.

In one example, the method 1100 also includes forming a third and a fourth Hall-effect sensor (e.g., 430 and 440 in FIG. 4 above). The method 1100 also includes forming an amplifier (e.g., 196) at 1106 having a pair of amplifier input terminals 197, 198 coupled to the first and second sense terminals 111, 113, 122, 124, and an output terminal 199. The method 1100 further includes die singulation or separation at 1108 and packaging at 1110 to provide a packaged electronic device.

Figure 12:
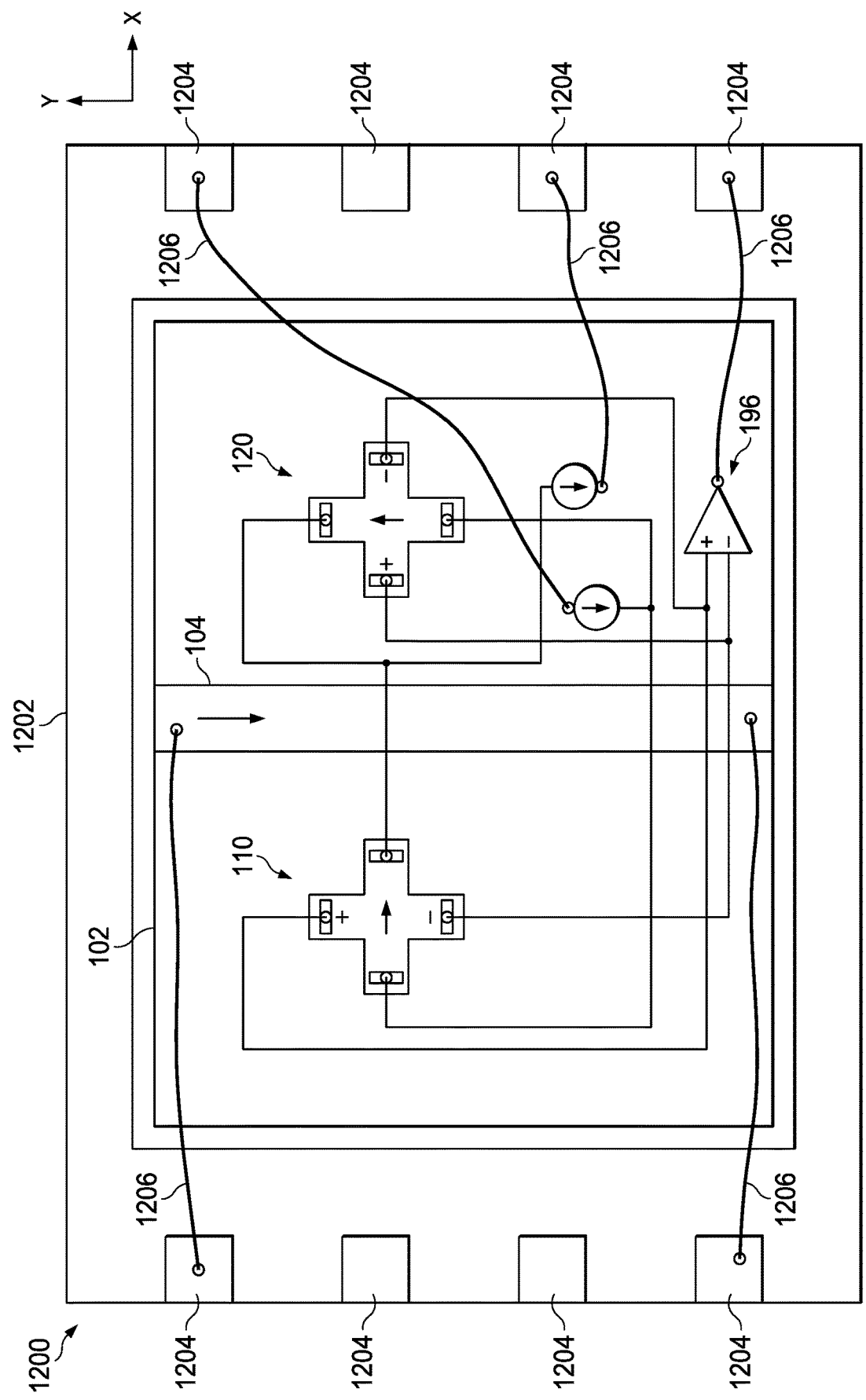
FIG. 12 is a top plan view of a packaged electronic device according to an embodiment of the invention.

FIG. 12 shows an example packaged electronic device 1200 that includes the substrate 102 separated from a processed wafer to provide a semiconductor die with the Hall-effect sensors 110 and 120 as described above in connection with FIGS. 1 and 2. In this example, the packaged electronic device 1200 includes the semiconductor substrate 102 with a first Hall-effect sensor 110, a second Hall-effect sensor 120 and an amplifier 196, the first Hall-effect sensor 110 has a first bias current direction parallel to a first direction X, a pair of first bias input terminals 112, 114 spaced apart from one another along the first direction X, and a pair of first sense output terminals 111, 113 spaced apart from one another along an orthogonal second direction Y. The second Hall-effect sensor 120 has a second bias current direction parallel to the second direction Y, a pair of second bias input terminals 121, 123 spaced apart from one another along the second direction Y, and a pair of second sense output terminals 122, 124 connected out of phase with the first sense terminals 111, 113, and the amplifier 196 has a pair of amplifier input terminals 197, 198 coupled to the first and second sense terminals 111, 113, 122, 124, and an output terminal 199. The packaged electronic device 1200 includes a package structure 1202, such as a ceramic material or a molded plastic structure that encloses the semiconductor substrate 102 and leads 1204 electrically coupled with circuitry of the substrate 102 and surfaces partially exposed outside the package structure 1202.

Modifications are possible in the described examples, and other implementations are possible, within the scope of the claims.

What is claimed is:

1. A system, comprising:
a first Hall-effect sensor having a pair of first bias terminals and a pair of first sense terminals, the pair of first bias terminals spaced from one another along a first bias current direction, the pair of first sense terminals spaced from one another along a direction orthogonal to the first bias current direction, and the pair of first sense terminals including a first positive terminal and a first negative terminal;
a second Hall-effect sensor having a pair of second bias terminals and a pair of second sense terminals, the pair of second bias terminals spaced from one another along a second bias current direction orthogonal to the first bias current direction, the pair of second sense terminals spaced from one another along a direction orthogonal to the second bias current direction, the pair of second sense terminals including a second positive terminal and a second negative terminal, the second positive terminal coupled to the first negative terminal, and the second negative terminal coupled to the first positive terminal; and
an amplifier having an output terminal and first and second inputs, in which the first input is coupled to a first one of the first sense terminals and a first one of the second sense terminals, and the second input is coupled to a second one of the first sense terminals and a second one of the second sense terminals.

2. The system of claim 1, wherein:
the first input is coupled to the first positive terminal and to the second negative terminal; and
the second input is coupled to the first negative terminal and the second positive terminal.

3. The system of claim 2, further comprising a conductor proximate to the first Hall-effect sensor and the second Hall-effect sensor in a plane of the first and second bias current directions.

4. The system of claim 3, wherein the conductor extends between the first Hall-effect sensor and the second Hall-effect sensor in the plane of the first and second bias current directions.

5. The system of claim 2, further comprising:
a third Hall-effect sensor having: a pair of third bias terminals spaced from one another along a third bias current direction parallel to the first bias current direction, and a pair of third sense terminals spaced from one another along a direction orthogonal to the third bias current direction, in which the pair of third sense terminals includes a third positive terminal and a third negative terminal; and
a fourth Hall-effect sensor having: a pair of fourth bias terminals spaced from one another along a fourth bias current direction parallel to the second bias current direction, and a pair of fourth sense terminals, in which the pair of fourth sense terminals includes a fourth positive terminal and a fourth negative terminal, the fourth positive terminal is coupled to the third negative terminal, and the fourth negative terminal is coupled to the third positive terminal;
in which the first input is coupled to at least one of the third and fourth Hall-effect sensors, and the second input is coupled to at least one of the third and fourth Hall-effect sensors.

6. The system of claim 5, wherein:
the first input is coupled to the third negative terminal and the fourth positive terminal; and
the second input is coupled to the third positive terminal and the fourth negative terminal.

7. The system of claim 5, further comprising a conductor proximate to the first Hall-effect sensor, the second Hall-effect sensor, the third Hall-effect sensor and the fourth Hall-effect sensor in a plane of the first and second bias current directions; in which: the conductor is: between the first Hall-effect sensor and the third Hall-effect sensor; and between the second Hall-effect sensor and the fourth Hall-effect sensor.

8. The system of claim 1, further comprising:
a third Hall-effect sensor having: a pair of third bias input terminals spaced from one another along a third bias current direction parallel to the first bias current direction; and a pair of third sense terminals spaced from one another along a direction orthogonal to the third bias current direction, in which the pair of third sense terminals includes a third positive terminal and a third negative terminal; and a fourth Hall-effect sensor having: a pair of fourth bias terminals spaced from one another along a fourth bias current direction parallel to the second bias current direction; and a pair of fourth sense terminals, in which the pair of fourth sense terminals includes a fourth positive terminal and a fourth negative terminal, the fourth positive terminal is coupled to the third negative terminal, and the fourth negative terminal is coupled to the third positive terminal;

in which the first input is coupled to at least one of the third and fourth Hall-effect sensors, and the second input is coupled to at least one of the third and fourth Hall-effect sensors.

9. The system of claim 8, further comprising a conductor proximate to the first Hall-effect sensor, the second Hall-effect sensor, the third Hall-effect sensor and the fourth Hall-effect sensor in a plane of the first and second bias current directions, in which the conductor is: between the first Hall-effect sensor and the third Hall-effect sensor; and between the second Hall-effect sensor and the fourth Hall-effect sensor.

10. The system of claim 1, further comprising a switching circuit and spinning state machine coupled between the Hall-effect sensors and the first and second inputs, the switching circuit and spinning state machine configured to selectively couple terminals of the Hall-effect sensors to the first and second inputs or to a bias current source in phases of a multi-phase current spinning sequence.

11. The system of claim 1, further comprising a busbar conductor on two sides of the first and second Hall-effect sensors in a plane of the first and second bias current directions.

12. A method of fabricating a packaged electronic device, the method comprising:
  forming a first Hall-effect sensor having: a pair of first bias terminals spaced from one another along a first bias current direction; and a pair of first sense terminals spaced from one another along a direction orthogonal to the first bias current direction, in which the pair of first sense terminals includes a first positive terminal and a first negative terminal;
  forming a second Hall-effect sensor having: a pair of second bias terminals spaced from one another along a second bias current direction orthogonal to the first bias current direction; and a pair of second sense terminals spaced from one another along a direction orthogonal to the second bias current direction, in which the pair of second sense terminals includes a second positive terminal and a second negative terminal, the second positive terminal is coupled to the first negative terminal, and the second negative terminal is coupled to the first positive terminal; and
  forming an amplifier having an output terminal and first and second inputs, in which the first input is coupled to a first one of the first sense terminals and a first one of the second sense terminals, and the second input is coupled to a second one of the first sense terminals and a second one of the second sense terminals.

13. The method of claim 12, wherein:
  the first input is coupled to the first positive terminal and the second negative terminal; and
  the second input is coupled to the first negative terminal and the second positive terminal.

14. The method of claim 12, further comprising:
  forming a third Hall-effect sensor having: a pair of third bias terminals spaced from one another along a third bias current direction parallel to the first bias current direction; and a pair of third sense terminals spaced from one another along a second direction orthogonal to the third bias current direction, in which the pair of third sense terminals includes a third positive terminal and a third negative terminal;
  forming a fourth Hall-effect sensor having: a pair of fourth bias terminals spaced from one another along a fourth bias current direction parallel to the second bias current direction; and a pair of fourth sense terminals, in which the pair of fourth sense terminals includes a fourth positive terminal and a fourth negative terminal, the fourth positive terminal is coupled to the third negative terminal, and the fourth negative terminal is coupled to the third positive terminal; and
  coupling the first input to at least one of the third and fourth Hall-effect sensors; and
  coupling the second input to at least one of the third and fourth Hall-effect sensors.

15. A packaged electronic device, comprising:
  a semiconductor die having a first Hall-effect sensor, a second Hall-effect sensor and an amplifier; the first Hall-effect sensor having: a pair of first bias terminals spaced from one another along a first bias current direction; and a pair of first sense terminals spaced from one another along a direction orthogonal to the first bias current direction, in which the pair of first sense terminals includes a first positive terminal and a first negative terminal; the second Hall-effect sensor having: a pair of second bias terminals spaced from one another along a second bias current direction orthogonal to the first bias current direction; and a pair of second sense terminals spaced from one another along a direction orthogonal to the second bias current direction, in which the pair of second sense terminals includes a second positive terminal and a second negative terminal, the second positive terminal is coupled to the first negative terminal, and the second negative terminal is coupled to the first positive terminal; and the amplifier having an output terminal and first and second inputs, in which the first input is coupled to a first one of the first sense terminals and a first one of the second sense terminals, and the second input is coupled to a second one of the first sense terminals and a second one of the second sense terminals;
  a package structure that encloses the semiconductor die; and
  leads having surfaces partially exposed outside the package structure.

16. The packaged electronic device of claim 15, wherein:
  the first input is coupled to the first positive terminal and the second negative terminal; and
  the second input is coupled to the first negative terminal and the second positive terminal.

17. The packaged electronic device of claim 15, further comprising a conductor proximate to the first Hall-effect sensor and the second Hall-effect sensor in a plane of the first and second bias current directions.

18. The packaged electronic device of claim 17, wherein the conductor extends between the first Hall-effect sensor and the second Hall-effect sensor in the plane of the first and second bias current directions.

19. The packaged electronic device of claim 17, further comprising:
  a third Hall-effect sensor having: a pair of third bias terminals spaced from one another along a third bias current direction parallel to the first bias current direction; and a pair of third sense terminals spaced from one another along a direction orthogonal to the third bias current direction, in which the pair of third sense terminals includes a third positive terminal and a third negative terminal; and a fourth Hall-effect sensor having: a pair of fourth bias terminals spaced from one another along a fourth bias current direction parallel to the second bias current direction; and a pair of fourth sense terminals, in which the pair of fourth sense terminals includes a fourth positive terminal and a fourth negative terminal, the fourth positive terminal is coupled to the third negative terminal, and the fourth negative terminal is coupled to the third positive terminal;

in which the first input is coupled to at least one of the third and fourth Hall-effect sensors, and the second input is coupled to at least one of the third and fourth Hall-effect sensors.

20. The packaged electronic device of claim 19, wherein:

the first input is coupled to the third negative terminal and the fourth positive terminal; and the second input is coupled to the third positive terminal and the fourth negative terminal.

\* \* \* \* \*